United States Patent
Schneider

(10) Patent No.: US 8,159,374 B2
(45) Date of Patent: Apr. 17, 2012

(54) UNICODE-COMPATIBLE DICTIONARY COMPRESSION

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 183 days.

(21) Appl. No.: 12/628,076

(22) Filed: Nov. 30, 2009

(65) Prior Publication Data
US 2011/0128167 A1  Jun. 2, 2011

(51) Int. Cl.
*H03M 7/34* (2006.01)
(52) U.S. Cl. .......................... 341/51; 709/213

(58) Field of Classification Search ............... 341/51, 341/50; 709/213, 225, 206, 223, 245; 712/22, 712/224, 300; 706/13; 707/100
See application file for complete search history.

(56) References Cited

U.S. PATENT DOCUMENTS
7,898,441 B2 * 3/2011 Cameron ................. 341/50
* cited by examiner

*Primary Examiner* — Joseph Lauture
(74) *Attorney, Agent, or Firm* — Lowenstein Sandler PC

(57) ABSTRACT

A character data set is compressed with a compression algorithm module of a computer system to generate one or more streams of encoded values. A code point mapper assigns the encoded values to code points reserved for private use in a Unicode format. An encoder encodes the streams of assigned encoded values using a Unicode Transformation Format (UTF). A dictionary of the compression algorithm initially includes code points assigned by the Unicode format. New entries are successively assigned to private use code points.

20 Claims, 3 Drawing Sheets

UNICODE-COMPATIBLE DICTIONARY COMPRESSION

TECHNICAL FIELD

Embodiments of the present invention relate to computing systems, and more particularly, to implementation of character data in different computer languages.

BACKGROUND

There is a mismatch between the data representation requirements of different programming languages. The motivating case is C, the implementation language for the Apache HTTPD web server, which presents character string data as a sequential array of octets, vs. JavaScript, which views characters in a string as indivisible and atomic. When a string that violates the implicit assumption of one character per octet location made by C is processed by a program implemented in C, and the result passed to a program implemented in JavaScript, which performs further processing before displaying a reconstructed string, chances are excellent that the displayed string will not be what was intended.

This is particularly a problem in the context of compression. Not only can character codes be potentially outside the range of a single octet, code values can also span octets.

BRIEF DESCRIPTION OF THE DRAWINGS

The present invention is illustrated by way of example, and not by way of limitation, in the figures of the accompanying drawings and in which.

DETAILED DESCRIPTION

Described herein is a method and apparatus for transcoding Unicode character data. A character data set is compressed with a compression algorithm module of a computer system to generate one or more streams of encoded values. A code point mapper assigns the encoded values to code points reserved for private use in a Unicode format. An encoder encodes the streams f assigned encoded values using a Unicode Transformation Format (UTF). A dictionary of the compression algorithm initially includes code points assigned by the Unicode format. New entries are successively assigned to private use code points.

Unicode is a mostly complete attempt at a universal character set. For most modern phoneme-based scripts (such as Latin or Cyrillic), all of the required characters in the script are in the first 55,296 characters. Indeed, for most languages, the number of characters used is a small fraction of the total range of Unicode characters.

Figure 1:
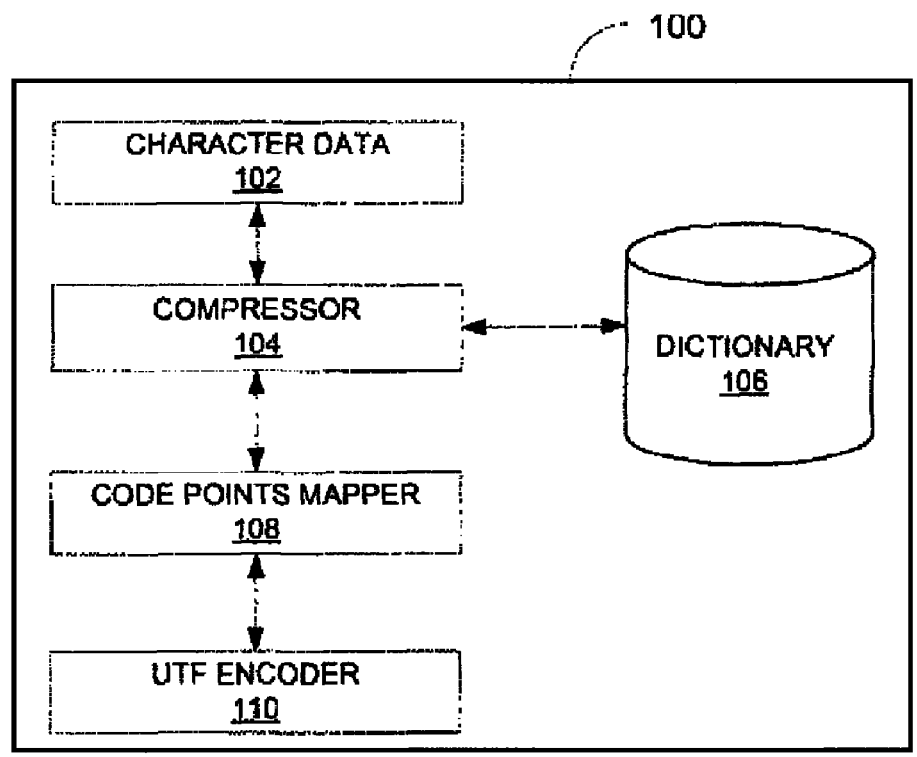
FIG. 1 is a block diagram illustrating one embodiment compatible compressor with a dictionary.

FIG. 1 is a block diagram illustrating one embodiment of a unicode-compatible compressor 100 with a dictionary 106. The unicode-compatible compressor 100 includes a character data receiver/generator 102, a compressor 104 associated with the dictionary 106, a code points mapper 108, and a UTF encoder 110. Character data receiver 102 generates or receives a set of character data. Compressor 104 uses a compression technique that generates one or more streams of encoded values. Code points mapper 108 assigns the encoded values to code points reserved for "private use" in the Unicode standard. UTF encoder 110 encodes the stream values using a Unicode Transformation Format. Encoding and decoding into a UTF would need to be managed at both ends, but this can be handled by standard components.

Note that the compression coder would have to make some decisions differently than it would in the case where a byte-based coding was used, because the "private use" code points have encodings that are typically larger than the encodings used by a byte-oriented encoder.

The Unicode standard specifies that code points U+E000-U+F8FF, U+F000-U+FFFFD, and U+100000-U+10FFFD are reserved for private use.

For illustration purposes, consider the compression of the prologue of "Romeo and Juliet":

Two households, both alike in dignity,
In fair Verona, where we lay our scene,
From ancient grudge break to new mutiny,
Where civil blood makes civil hands unclean.
From forth the fatal loins of these two foes
A pair of star-cross'd lovers take their life;
Whose misadventur'd piteous overthrows
Doth with their death bury their parents' strife.
The fearful passage of their death-mark'd love,
And the continuance of their parents' rage,
Which, but their children's end, naught could remove,
Is now the two hours' traffic of our stage;
The which if you with patient ears attend,
What here shall miss, our toil shall strive to mend.

A straight-forward adaptation of LZW can be used to compress this. LZW compression works by beginning with a work string set to the empty string. For each successive character, if the work string augmented by the current character is in the dictionary, the current character is appended to the work string. Otherwise it emits the dictionary index of the work string, adds a string composed of the work string and the current character to the dictionary, and sets the work string to a string consisting of just the current character.

To modify this for a Unicode-safe coder, the "dictionary" would initially consist of the code points assigned by the Unicode standard (which would be identity mapped), and new entries would be successively assigned to "private use" code points.

Coding this way using a target UTF of UTF-16 would always assign a code point to new dictionary entries (since every string added to the dictionary would consist of at least two characters, replacing a string with a dictionary reference is guaranteed not to expand the result, even if the dictionary reference is a code point that requires a surrogate encode).

With respect to UTF-8, "private use" code points require 3 or 4 bytes to encode using UTF-8. So, compressor 104 would only use dictionary entries for strings that require at least that many bytes to encode natively. The dictionary entries for these shorter strings can either be assigned to private use code points, or they can be tracked in a "virtual" table, saving the private use code points for strings that could actually be used.

For UTF-16, compressor 104 encodes the sample into 393 code points (encoded as 796 bytes, not including the BOM). This compares to the original sample, which consists of 632 code points (encoded as 1,264 bytes in UTF-16, not including the BOM). For UTF-8, the sample is encoded into 554 code points, which requires 624 bytes to encode.

In another embodiment, the LZW adaptation can he augmented with virtually any LZW improvement. For example, the string assignments to private use code points can be reordered so that more frequently used strings are more likely to be in the first range of private use code points (which only take 3 bytes to code, versus 4 bytes for the other two ranges). This reordering also lets an implementation prune the dictionary when it overflows.

The compression ratio achievable with LZW is modest. However, it can be tuned to guarantee that the compressed string will never be longer than the uncompressed string, when coded using the same target LTF. In contrast, a binary compressor cannot make the same claim.

This method is not limited to LZW. In accordance with another embodiment, an adaptation of LZSS can also be implemented rather easily. LZSS is a dictionary-based compression technique where the coder searches the previously seen text within some window for an occurrence of the current to-be-encoded text. If a match of sufficient length is found, a flag hit, an encoded length, and an encoded offset are added to the output stream. If a match is not found, a flag bit (set to the opposite value as the flag bit above) and the current character are added to the output stream.

This adaptation would be accomplished by encoding offset and length information using the "private use" code points. Note that since the private use code points can be unambiguously distinguished from the other code points, there is no need to include separate flag bits.

The private use code points can be assigned to offset-length pairs in whatever manner makes sense the implementer. The offsets and lengths can be combined into a single code point, or a separate code point can be used for each, or some combination of the two can be used.

For a concrete example, using UTF-8 as the target UTF, we can assign the code points in the first private use area to short offsets and lengths, the second private use area to longer lengths and moderate offsets, and the third area to still longer lengths, and much longer offsets.

For instance the range U+E000-U+E0FF can be assigned to the pairs "length 1, offset 1" through "length 1, offset 256", U+E100-U+E1FF to "length 2, offset 1" to "length 2, offset 256", all the way through assigning U+F800-U+F8FF to "length 25, offset 1" through "length 25, offset 256". The length 1 and length 2 match codes are likely to he rarely used, but it is possible that a length 1 match can he more efficiently coded using a code point from this range, if the match is for a code point not on the Basic Multilingual Plane (a code point outside the range U+0000-U+FFFD).

The range U+F0000-U+FFFFD could be partitioned so that the offset from the first code point is separated into a length and part of an offset, with a following code point making up the rest of the offset. For instance, code points in the range U+F0000 to U+F7FFF could be partitioned into a 7 bit and an 8 bit quantity (say, by considering only the low order 15 bits of the code point's scalar value, and using the high order 7 bits and low order 8 bits of this 15-bit value). The 7 bit quantity can he interpreted as a binary integer representing the length of a match, and the 8 bit quantity can be interpreted as the low order 8 bits of an offset value. The higher order bits would be provided by the following code point. Since there is no possible way for this coding to produce an offset—length pair that occupy fewer than five bytes, the shortest match supported by this coding would be 2.

Care should he taken that the following code point does not present difficulties to the decompressor. The most likely cause of problems would be the use of code points that represent "control characters". So, the ranges U-0000-U+0020 and U+007F-U+00A0 should be excluded. If the range is limited to the following code point U+0021-U+FFFD, exclusive of the range U+007F-U+00A0, that is 65,446 available code points, for an offset range of 1-16,759,296.

The ranger U+F8000-U+FBFFF can he partitioned to allow for longer matches and shorter offsets by subtracting 0xf8000 from the scalar value of the code point, and partitioning the resulting 14 bit value into a 10 bit length and a 4 bit low-order offset part, using the following code point as the higher bits. Since the previous coding is adequate to any length up to 129 characters, the match length would be offset by 130, covering the range 130-1153. Using the code point restriction listed above, the offset would be limited to the range 1-1,047,136.

This leaves several private use code points available, but for now this is adequate to illustrate the process. The UTF-8 encoded compressed result occupies 504 code points, or 559 bytes. This is better than the LZW coder. It also requires much less memory on the decompression side (the LZW coder requires memory proportional to n 1n n, where n is the number of code points, whereas the LZSS coder only requires memory proportional to n).

There are two different variants of LZSS presently described—one where the offset and length pairs are encoded using PUA code points, and one where offset and length pairs are coded using characters from a restricted range of the Unicode character set. The second variant is dependent upon flag characters for signaling how characters should be managed. Flag states are further discussed below with respect to FIG. 2.

The following example demonstrate an example of a coding that contains characters outside the range U+0000-U+007F.

π r not squared. π r round, cake r squared.

For the LZW case, in order to demonstrate actual compression, UTF-16 is used as the output target.

To start, the working string is empty. The first character is appended to the working string, and this is checked for in the dictionary. Since 'π' is in the dictionary (which starts out as just the Unicode character set), the process proceeds to the second character. The string 'π ' is not in the dictionary, so the code for the working string (U+03C0, or the character 'π') is appended to the output stream. The working string is concatenated with with following character (' '-the space character) and added to the dictionary (at PUA code point U+E000). The working string is replaced with the next successive character, becoming the string ' '.

This pattern is repeated until the second occurrence of it 'π r' in the input stream, at which point the output stream is 'π r not squared.', and the following strings have been assigned to character points in the PUA:

'π '—U+E000
' r'—U+E001
'r '—U+E002
' n'—U+E003
'no'—U+E004
'ot'—U+E005
't'—U+E006
's'—U+E007
'sq'—U+E008
'qu'—U+E009
'ua'—U+E00A
'ar'—U+E00B
're'—U+E00C
'ed'—U+E00D
'd'—U+E00E
'.'—U+E00F
' '—U+E010
'π'—U+E011

The working string is 'π'. Since 'π' appears in the dictionary, the next character is appended to the work string, making it 'π'. As 'π r' is not in the dictionary, the code for the work string (U+E000) is appended to the output stream, the string 'π r' is added to the dictionary as U+E012, and the work string becomes 'r'. The output stream is now "π r not squared. \x{e000}". A Perl string quoting convention is used here—"\x{abcd}" is the Unicode character corresponding to U+ABCD.

Continuing, the string 'r' is in the dictionary, but 'r r' is not, so the code for the string 'r' (U+E002) is appended to the output stream, the string 'r r' is added to the dictionary at U+E013, and the working string becomes 'r'.

At this point, the strings 'ro', 'ou', 'un', and 'nd' are not found in the dictionary, so the characters 'roun' are appended to the output stream, making it "π r not squared. \x{e000}\x{e002}roun". The strings 'ro', 'ou', 'un', and 'nd' are added to the dictionary at U+E014, U+E015, U+E016, and U+E017, respectively. The working string is 'd.', 'd.' is in the dictionary, but 'd.' is not. So, the code for 'd.' (U+E00E) is appended to the output stream, the string 'd.' is added to the dictionary at U+E018, and the work string becomes ' '. Similarly, ' ' is in the dictionary, but 'c' is not, so the code for ' ' (U+E010) is appended to the output stream, the string 'c' is added to the dictionary at U+E019, and the working string becomes 'c'. The output stream at this point is "π r not squared.\x {e000}\x{e002}roun\x{e00e}\x{e010}".

The strings 'ca', 'ak', 'ke', and 'e ' are not in the dictionary, so the characters 'cake' are appended to the output stream, and the strings 'ca', 'ak', 'ke', and 'e ' are assigned to the characters U+E01A, U+E01B, U+E01C., and U+E01D, respectively. The string 'r' is in the dictionary, but 'r' is not, so the code for the string 'r' (U+E001) is appended to the output stream, and the code U+E01E is assigned the s ring 'r'. The working string is now ' '. The output string is now "π r not squared. \x{e000}\x{e002}roun\x{e00e}\x{e010}cake\x{e001}".

Continuing, 's' is in the dictionary, but 'sq' is not, so the code for 's' (U+E007) is appended to the output stream, and 'sq' is assigned the code point U+01F. Similarly, 'qu' is in the dictionary, but 'qua' is not, so the code for 'qu' (U+E009) is appended to the output stream, and 'qua' is assigned the code point U+E020. Then, 'ar' is in the dictionary, but 'are' is out so the code for 'ar' (U+E00B) is appended to the output stream, and the string 'are' is assigned the code point U+E021. Then, 'ed' is found in the dictionary, but 'ed'. is not, so the code for 'ed' (U+E00D) is appended to the output stream, and the string is assigned the code point U+E022. The final '.' is followed by nothing, so it's appended to the output stream by itself. The final output stream is:

π r not squared. \x{e000}\x{e002}roun\x{e00e}\x{e010}cake\x{e001}\x{e007}\x{e009}\x{e00b}\x{e00d}.

The output stream is 36 characters long, compared to an input length of 45 characters. This is a 20% savings. For UTF-8, there was no coding that would he more compact than a direct representation of the characters.

Compressing using LZSS with PUA assignments as specified in the application, with UTF-8 as the, input: Recall that the input string is:

π r not squared. π r round. cake r squared.

The compressor would not he able to find an match until the second 'π r'. That would be a match at offset 18, length 4, which would be encoded as U+E311. The next several characters would also not match, until the 'd.' string, which is a match at offset 12, length 4, which would be encoded as U+E30B. The string 'cake' does not have a previous match.

The string 'r' matches, but the encoding of the offset and length would take the same amount of space as the characters themselves, so they can be output as-is. This decision also means that the final match for 'squared.' becomes 'squared', which is a match at offset 29, length 9, which is encoded as U+E81C. The final output stream is:

π r not squared. \x{e311}roun\x{e30b}cake r\x{e81c}

This is 31 characters, or 38 bytes, compared to 45 characters, or 47 bytes of input (savings of 19.1%, based on bytes).

For the variant with explicit flags, using UTF-8 as the output:

The first character is neither an efficient safe nor an unsafe character, so it does not affect the flags state. It is appended to the output buffer as-is. The next character is a space character, which is an unsafe character. It is transcoded to the character 'C' (U+0043). The transcoded character is appended to the output buffer and the flag state is updated to 'U'.

Continuing, 'r' is safe, so the flag state becomes US, and the output buffer becomes 'πCr'. The next character (' ') is unsafe, but the flag set does not include a coding for the flag state USU, so the flag character corresponding to the current flags state US is output, followed by the output buffer. The output stream would contain:

=πCr

The next character (' ') is transcoded and added to the (now empty) output buffer, and the flags state is updated to U. The next three characters are safe, so they are added to the output buffer, as-is. The output buffer becomes 'Cnot', and the flags state is USSS. Since there is no coding for USSSU, the processing of the ' ' character would need to be deferred until the the current flags and buffer are output. The coding for USSS would be the character 'T'. The output stream would become:

=πCrTCnot

Again, ' ' is unsafe, and the next several characters are safe. The longest run of safe character flags following an unsafe character flag that can be coded is USSSSSS, so the space character and six following characters can be processed. The output stream would become:

=πCrTCnot}Cquare

The next two characters are safe, followed by an unsafe character. However, no coding for two safe and two unsafe characters is available, so the flag for two safe and an unsafe character, followed by the next three characters (transcoded as necessary) are appended:

=πCrTCnot}CsquareId.C

The next character is unsafe and it's followed by a match of offset 18, length 4. However, no coding for UM exists, so the flag for the U state is appended to the output stream followed by the transcoded space character:

=πCrTCnot}CsquareId.C4C

Encoding the match requires the character string '4!%', which is appended to the output buffer. The flags state is M. This is followed by four "safe" characters, and another match at offset 12, length 4. The coding for MSSSSM does not exist, so the coding for MSSSS is emitted, followed by the encoded (first) match, followed by the four "safe" characters:

=πCrTCnot}CsquareId.C4C;4!%rouon

The flag state is now M, the output buffer contains '.!%'. The coder next encounters four safe characters and an unsafe character, which causes it to emit the coding for the flag state MSSSS, followed by an output buffer:

=πCrTCnot}CsquareId.C4C;4!% roun;.!% cake

The next three flag states are U, S, and M. US is encoded as '=', the next two characters are encoded as "Cr", the M flag is encoded as '(', and the match at offset 29, length 9 is encoded as '?!+'. The final output stream is:

=πCrTCnot}CsquareId.C4C;4!% roun.!% cake=Cr(?!+

This is 46 characters, or 47 bytes (encoded as UTF-8), so it provides no savings over the original string. There are two reasons for using this type of encoding:

The flags are more flexible—it can be tuned to a particular application. Indeed, with a "tuned" flags encoding for the flag state USUSSSUSSSSSSSUUMSSSSMSSSSUSM, this would have taken one more character and byte than the coding that uses the PUA.

2) In sonic applications, the PUA may not be available for this usage. For instance both Apple and Adobe reserve several characters in the first PUA for their own internal uses, so using this kind of compression with either of their products could be problematic.

Figure 2:
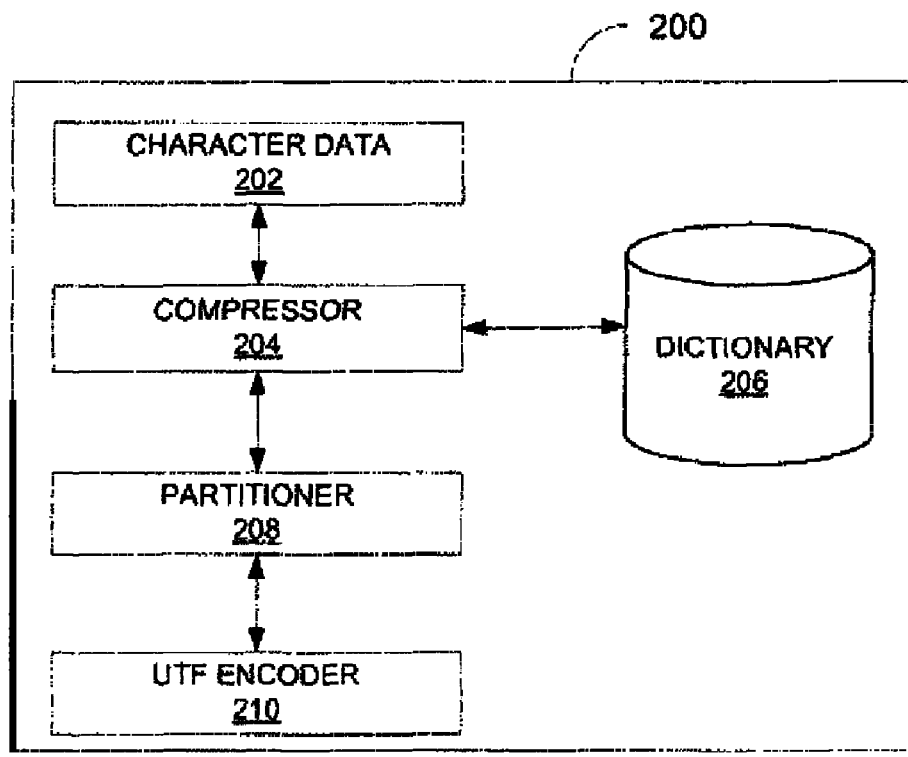
FIG. 2 is a block diagram illustrating another embodiment of a unicode-compatible compressor with a dictionary.

FIG. 2 is a block diagram illustrating another embodiment of a unicode-compatible compressor 200 with a dictionary 206. The unicode-compatible compressor 200 includes a character data receiver/generator 202, a compressor 204 associated with the dictionary 206, a partitioner 208, and a UTF encoder 210. Character data receiver 202 generates or receives a set of character data. Compressor 204 uses a compression technique that generates one or more streams of encoded values. Partitioner 108 partitions the Unicode character set into "safe" and "unsafe" characters. UTF encoder 110 encodes the stream values using a Unicode Transformation Format.

"Safe" characters can represent themselves safely in the output stream., and have no special significance within a quoted string in most client applications. The "safe" characters are those code points exclusive of the range U+0000-U+001F (the "control" characters), the character U+0020 (the space character), the character U+0022 (the double quote (") character), the character U+0027 (the single quote (') character), the character U+005C (the backslash (\) character), the character U+007F (the delete character), and the range U+0080-U+009F (the second control character set). Implementations with more restrictive requirements for safe characters (such as excluding the '<' and '>' characters for XML and HTML applications) are also possible, and the construction would be analogous.

In a UTF-8 application, there are 91 "safe" characters that require a single octet to encode. In a UTF-16 application, there are 63,385 "safe" characters that require a single coding unit (16 bits, two octets) to encode. For maximum compatibility a UTF-16 coder may want to avoid characters in the BMP private use area (the 6,400 characters with code points U+E000-U+F8FF), leaving 56,985 characters in both cases, there are 69 "unsafe" characters. When the coder needs to emit a character in the range of unsafe characters (which happens when it is handling one of these characters as a literal), it is transcoded to the safe character range, and the safe character is emitted in its stead (with appropriate signaling to the decoder). These two "safe" character sets (the 91 single octet characters in the UTF-8 case and the 63,385 or 56,985 single coding unit characters in the UTF-16 case) are the "efficient safe" characters. Any character that is not an "unsafe" character or an "efficient safe" character can be passed through by the coder, since it can only represent itself to the decoder.

The number of characters available in the efficient safe ranges of characters influences the choice of dictionary size and lookahead window, because some choices will he more efficient than others. In particular, using a dictionary and window sizes that do not form a product that's close to a power of the number of "safe" efficient characters. For the UTF-8 case, a dictionary size of 8281 with a tookahead of 91 was the natural choice: an offset would take two "efficient safe" characters to encode, and the length would take one, for a total of three octets. In the UTF-8 coding case, the coder needs to allow for the possibility of a single character match—a Unicode character not on the BMP takes four octets to encode in UTF-8, so an offset-length pair with a length of one is more space-efficient than coding the character directly.

For the UTF-16 case, there are several possibilities. One is to use a dictionary size of 1811 characters with a lookahead of 35 (or 1965×29, if PUA is excluded in the BMP)—this would require a single coding unit to encode. However, it is probably only efficient for very short texts. An alternative would be a variable length coding, either explicitly flagged, or implicit in the variable length coding. An explicitly flagged variation could use a one or two character coding, depending on the flag value. A single character coding could provide offsets and lengths as detailed earlier (say 1811×35 or 1965×29, depending whether the PUA is excluded from the efficient safe character set or not). The two character encoding could allow for much Larger dictionaries and lookaheads. The two character coding cannot be more efficient than a single character coded as itself, so the minimum match length in this case would need to be 2.

The maximum match length depends on how long the dictionary is. Using an efficient safe character set of 56,985 characters gives over 3 billion combinations of offset-length pairs, and the 63,385 character possibility gives just over 4 billion. Most LZSS coders are implemented so that the dictionary size is approximately the square of the lookahead size (more exactly, the dictionary size is typically the square of the maximum encoding of the length, plus one; a coder that uses a 24 bit offset-length pair will typically have a dictionary with a length of 65,535 or 65,536 bytes, with a lookahead of 260 bytes). Using this partitioning scheme leads to a dictionary size of 2,488,345 with a lookahead of 1,306 for the 56,985 character case, and a dictionary size of 2,218,475 with a lookahead of 1,812 for the 63,385 character case—this is as close as one can get to having a dictionary size be the square of the lookahead size, and still use every available encoding. Of course, other partitioning are possible, and may or may not use the entire possible range of codings.

An implicit variable length code would reduce the number of available codings, because it would need to signal by itself how it should be interpreted. However, it is more flexible, and would enable the efficient coding of cases that be coded above. For concreteness, I'll build the coding around the 56,985 character case—the coding built around the 63,385 character case is analogous. It is likely that most matches are going to be either very close, or very short. So, the encoding should be optimized for these two cases, if we partition the available characters into sets with sizes of 24,492, 18,995, and 9,498, respectively, we can assign short offsets to the first pool, short lengths to the second pool, and 2 character codings to the third pool.

The first pool (of 24,492 characters) encodes a mixed-radix integer with bases 68 and 419. The two encoded integer "digit" values are the length and offset, respectively of the match. The second pool is used to encode short matches that occur farther away than 418 characters. It is able to encode matches of up to 5 characters in length, with offsets ranging from 419 to 4,217. The encoding is of a mixed-radix integer with bases 5 and 3,799; the second integer is biased by 419 to give the offset.

In the event that the match exceeds one character in length, but cannot be coded by either of the two codings above, the third pool is used, together with a following character. This gives a total of 541,243,530 possibilities. For the application domain, a longer match length would be favorable over a longer dictionary size, so an offset in the range 1-622,119, with a match in the range 2-871, would be a good candidate. Alternately, the coding character from the third pool could designate a match length in the range 2-9,499, with an offset in the range 1-56,985, given by the second character.

This variable length coding can accommodate matches that would he rejected with the external flag scheme, such as an offset of 2,000 with a length of 1 (which would require a single coding unit with this scheme, but may require two coding units as a literal).

Turning now to flags—this variant of LZSS requires sets of multi-valued flags; even if single bit flags were efficient (which they are not in this implementation), they would not be adequate. Further, the input stream dictates the probability of a particular flag accurring at a particular point in time. These two considerations suggest that a variable number of flag states should be packed into a single efficient safe character, and this flag character emitted before the characters it controls are added to the output stream.

In the UTF-8 case, and the UTF-16 case with an implicit variable length coding the offsets and lengths, there are three different flag states for each possible point in the code stream where a coded entity occurs—the coded entity could be a literal character from the efficient safe character set, the coded entity could be a transcoded literal from the unsafe character set, or the coded entity could be an encoded offset-length pair. The UTF-16 case with an explicit variable length coding has two possible codings for the offset-length pair that need to be disambiguated, so there are four cases with that coding.

Charaeters outside the range of the efficient safe character set either represent themselves unambiguously (those safe characters outside the efficient safe set), or are not part of the coding, and should be discarded. The unsafe characters could be inserted in gateways and proxies, or they could he inserted by the coder itself to present the coded output stream in a format acceptable to a client with limitations on line lengths or variable sizes.

The following implementation considers UTF-8 and implicit variable length coding UTF-16 case. The other UTF-16 case is very similar. To construct the different possible flag values, the coder needs a probability model that it can communicate with the decoder. The probability model chosen is simple and robust, and only requires tracking 9 values to implement (16, in the UTF-16 with explicit variable length coding case). The 9 values are the conditional probabilities of a particular flaw value, given the current flag value, and this can be mapped to counts. This is essentially a PPM model with a single "character" context and a fully populated tree.

The coder can either calculate these values globally (for sonic or all of the input stream and pass them to the decoder as a series of values in the preamble to the code stream, or they can be calculated dynamically.

In the static case, the coder determines the conditional probabilities from counting flag transitions, and using these counts to determine how to pack flags into the flags word. The first four flag values are for "no flag", a single safe character, a single unsafe character, and an offset-length. The "no flags" flag character can he used by a streaming coder that gets a stream of safe characters outside of the efficient safe character set, sufficient to overflow the internal buffer it's using for buffering the generated code stream until a full flag character can be output. The single flag values are also there for similar reasons.

To generate additional flag values, the current flag string values are extended by every possible flag value, the conditional probability of the extended flag strings are calculated, and the entire set is sorted, with only enough flag strings retained to fill the remaining flag slots retained. This process is iterated until no more changes are made to the set of flag strings that are retained.

For example, using the UTF-8 efficient safe character set of 91 entries, if the flag states are symbolized as "M" for a match "S" for a safe character, and "U" for an unsafe character, with the following conditional probabilities (expressed as integer counts, and taken from coding an example; text):
MM—31,323
MS—25,67
MU—3
SM—26,005
SS—115,176
SU—10,176
UM—3,196
US—10,553
UU—1,468

These counts would likely be scaled to fit within a particular range. For the UTF-8 case, the appropriate range is 0-8280. Scaling these values yields the following adjusted values:
MM—31,323*8,280/115,176=2,251
MS—25,627*8,280/115,176=1,842
MU—3,573*8,280/115,176=256
SM—26,005*8,280/115,176=1,869
SS—115,176*8,280/115,176=8,280
SU—10,176*8,280/115,176=731
UM—3,196*8,280/115,176=229
US—10,553*8,280/115,176=758
UU—1,468*8,280/115,176=105

These scaled counts lead to the following conditional probabilities (expressed as fractions):
MM—2,251/(2,251+1,842+256)=2,251/4,349 MS—1,842/4,349 MU—256/4,349
SM—1,869/(1,869+8,280+731)=1,869/10,880 SS—8,280/10,880 SU—731/10,880
UM—229/(229+758+105)=229/1,092
US—758/1,092
UU—105/1,092

In order to convert these conditional probabilities into true probabilities (that is, the probability of matching a string of two consecutive, flags), one need to scale them by the probability of the first flag value. This can be approximated by taking the sum of each first flag, and dividing by the total count over the whole set. For instance, the sum of the counts for MM, MS, and MU is 4,349. The sum of all the counts is 16,321. Therefore, the probability of M, independent of the previous flag, is approximately 4,349/16,321. Similarly, the probability of S is 10,880/16,321 and U is 1,092/16,321.

Fractions with integer numerators and denominators were used to this point, because the input data is integers. However, fractions with various different denominators are difficult to manage. One could convert to floating point, but floating point math is slower than integer math—for a single round of flag string creation, the speed hit may be acceptable. For the dynamic case, it is not a good option.

Rather than using floating point math, we can use a fixed, implicit denominator, and make explicit adjustments to the values we keep as the numerators. For an implementation suitable for decoding on a client that only has access to signed 32 bit arithmetic, the appropriate denominator to use is 46,340—no multiplication would ever exceed $2^{31}$. At a slight loss of precision, the value 32,768 would he a faster choice (it would replace multiplications and divisions by shifting, during the normalization operations).

The conditional probabilities, when normalized to the denominator 46,340, become:
MM—floor(2,251/4,349*46,340)=23,985
MS—floor(1,842/4,349*46,340)=19,627
MU—floor(256/4,349*46,340)=2,727
SM—floor(1,869/10,880*46,340)=7,960
SS—floor(8,280/10,880*46,340)=35,266
SU—floor(731/10,880*46,340)=3,113
UM—floor(229/1,092*46,340)=9.717
US—floor(758/1,092*46,340)=32,166
UU—floor(105/1,092*46,340)=4,455

The unconditional probabilities become M—12,348; S—30,891; U—3,100

Using these scaled, implicit fractions, we can generate the strings as follows:
Iteration #1:
None—(fixed, count 46,340)
M—(fixed, count 12,348)
S—(fixed, count 30,891)
U—(fixed, count 3,100)
MM—floor(12,348*23,985/46,340)=6,391 MS—floor(12,348*19,637/46,340)=5,229
MU—floor(12,348*2,727/46,340)=726 SM—floor(30,891*7,960/46,340)=5,306 SS—floor(30,891*35,266/46,340)=23,508 SU—floor(30,891*3,113/46,340)=2,075 UM—floor(3,100*9,717/46,340)=650 US—floor(3,100*32,166/46,340)=2,151 UU—floor(3,100*4,455/46,340)=298

Iteration #2 adds an additional 27 strings to the table:
MMM—3,307; MMS—2,706; MMU—376
MSM—898; MSS—3,979; MSU—351
MUM—152; MUS—503; MUU—69
SMM—2,746; SMS—2,247; SMU—312
SSM—4,038; SSS—17,890; SSU—1,579
SUM—435; SUS—1,440; SUU—199
UMM—336; UMS—275; UMU—38
USM—369; USS—1,636; USU—144
UUM—62; UUS—206; UUU—28

Iteration #3 adds 81 strings; in the UTF-8 case, as there are only 87 slots available, weeding out the low frequency strings. The resulting table and counts are:
None—(fixed, count 46,340)
M—(fixed, count 12,348)
S—(fixed, count 30,891)
U—(fixed, count 3,100)
SS—23,508
SSS—17,890
SSSS—13,614
MM—6,391
SM—5,306
MS—5,229
SSM—4,038
MSS—3,979
MMM—3,307
SSSM—3,073
MSSS—3,028
SMM—2,746
MMS—2,706
SMS—2,247
US—2,151
SSMM—2,090
SU—2,075
MMSS—2,059
MMMM—1,711
SSMS—1,710
SMSS—1,710
USS—1,636
SSU—1,579
SUS—1,440
SMMM—1,421
MMMS—1,400
USSS—1,245
SSSU—1,201
SMMS—1,163
SSUS—1,096
SUSS—1,095
MSM—898
MU—726
MSSM—683
UM—650
MUS—503
MMSM—464
MSMM—464
SUM—435
SMSM—385
MUSS—382
MSMS—380
MMU—376
USM—369
MSU—351
UMM—336
SSUM—331
SMU—312
UU—298
USSM—281
UMS—275
MSSU—267
MMUS—260
SUSM—247
MSUS—243
SSMU—237
SUMM—225
SMUS—216
UMSS—209
UUS—206
SUU—199
MMMU—194
USMM—190
SUMS—184
MMSU—181
UMMM—173
SMMU—161
USMS—156
UUSS—156
MUM—152
SSUU—151
SMSU—150
USU—144
UMMS—142
SUUS—138
USSU—109
USUS—99
SUSU—96
MUSM—86
MUMM—78
MMUM—78
MSUU—73
MUU—69
SMUM—65
MUMS—64
UUM—62
MSMU—52

After 13 iterations, the following flags list emerges:
None (fixed)
S—30891
SS—23508
SSS—17890
SSSS—13614
M—12348
SSSSS—10360
SSSSSS—7884
MM—6391
SSSSSSS—5999
SM—5306
MS—5229
SSSSSSSS—4565
SSM—4038
MSS—3979
SSSSSSSSS—3474
MMM—3307
U—3100
SSSM—3073
MSSS—3028
SMM—2746
MMS—2706
SSSSSSSSSS—2643
SSSSM—2338
MSSSS—2304
SMS—2247
US—2151
SSMM—2090
SU—2075
MMSS—2059
SSSSSSSSSSS—2011
SSSSSM—1779
MSSSSS—1753
MMMM—1711
SMSS—1710
SSMS—1710
USS—1636
SSSMM—1590
SSU—1579
MMSSS—1566
SSSSSSSSSSSS—1530
SUS—1440
SMMM—1421
MMMS—1400
SSSSSSM—1354
MSSSSSS—1334
SMSSS—1301
SSMSS—1301
SSSMS—1301
USSS—1245
SSSSMM—1210
SSSU—1201
MMSSSS—1191
SSSSSSSSSSSSS—1164
SMMS—1163
SSUS—1096
SUSS—1095
SSMMM—1081
MMMSS—1065
SSSSSSSM—1030
MSSSSSSS—1015
SMSSSS—990
SSMSSS—990
SSSMSS—990
SSSSMS—990
USSSS—947

SSSSSMM—920
SSSSU—914
MMSSSSS—906
MSM—898
MMMMM—885
SMMSS—885
SSMMS—885
SSSSSSSSSSSSSS—885
SSUSS—834
SSSUS—833
SUSSS—833
SSSMMM—822
MMMSSS—810
SSSSSSSSM—784
MSSSSSSSS—772
SMSSSS—753
SSMSSS—753
SSSMSSS—753
SSSSMSS—753
SSSSSMS—753
SMMMM—735
MU—726
MMMMS—724
USSSSS—720
SSSSSSMM—700

Experience with this set of flags, on the sample data from which the probabilities were derived, shows that this construction saved over 50% of the flag characters used in a more "balanced" approach. However, this may not be the most efficient compression possible. In the UTP-8 case, the encoded text requires an additional 18 characters to encode the scaled character counts. Further, the counts may not be locally accurate—in particular, during the starting phase of the compression process, when there are few characters in the compression dictionary, there will be proportionately more safe and unsafe characters appended to the output than matches, whereas a mostly full dictionary would lead to proportionately more matches. So, a dynamic coder is likely to lead to better results.

In accordance with another embodiment, the dynamic coder has a set of mappings from flag character to flag string based on a simple model—this model can have adjustable parameters, or be hard coded. It just takes the presumed counts for the M, S, and U states, and multiplies the resulting probabilities to obtain provisional conditional probabilities. The counts can be hard-coded; for example, using the data from the sample of text, the counts would be M—12,348; S—30,891; U—3,100. The counts could also be provided by the coder. The range is not very large, about 10 to 1. A compact way to encode this would be to scale the largest count value to 36, scale the other values proportionately, and indicate the ordering with a value in the range 0-5, then code the three values as a base-37 integer, transcoded into a pair of efficient safe characters. For this example, S would be the count that gets scaled to 36. Proportionately, M would become 14, and U would become 3. If we enumerate the orderings as follows;

MSU—0; MUS—1; UMS—2; USM—3; SUM—4; SMU—5

The triplet 5, 14, 3, when interpreted as base-37 digits, gives the value 7,366, which can be transcoded to the efficient safe characters corresponding to the values 80, 86.

Generating the probabilities to use would consist of translating these counts into implicit fractions, and then constructing a conditional probability table, and then finally constructing the flag strings to use. Converting the counts M—14;

S—36; U—3 to implicit fractions yields M—floor(46,340*14/53)=12,240; S—floor(46,340*36/53)=31,476; U—floor(46,340*3/53)=2,623. The conditional probabilities would wind up being the individual probabilities themselves. For instance, the implied conditional probability of MM, given M, would be the same as the probability for M, independent of any previous flag state. Once the model is preloaded with these working assumption, the flag strings are generated.

The model evolves by keeping track of the conditional probabilities of each type of flag. The coder can either recalculate the flag string every time it emits a flag and empties its buffer, or it can signal the decoder that it will be recalculating its flag strings by using a special reserved flag value. Given the amount of work required to generate the flag strings, this is the preferred embodiment. The coder can send the recalculate flag when it determines that it would produce better compression, or just send it every few flag characters.

In accordance with another embodiment, another improvement for streaming applications is to include a flush flag—this flag tells the decoder to throw away its accumulated statistics about the flags and start over from the model assumptions; it could be followed by new model parameters, or the decoder could just use the ones it already has. This flush flag could also signal that the dictionary buffer needs to be purged, too, or a separate flush flag could be used for that. In accordance with another embodiment, another way to send out-of-band information to the decoder would he to signal an "unsafe" character, and then use a character that's not assigned for transcoding purposes. In the example case, there are 91 "sate efficient" UTF-8 characters but only 69 unsafe characters: this leaves 22 possibilites for flags usage.

Using the second LZSS variant, and the flags constructed as outlined in the application, compressing "abracadabra" would work as follows:

At abracadabra, there is nothing in the dictionary that could be matched—the character is a safe character, so the flag state becomes S, and the character "a" is appended to a coding buffer.

At abracadabra, the compressor still can't find a match, so the flag state transistions to SS, and "b" gets appended to the coding buffer.

The coder does the same operations for the next several characters, evolving the flag state to SSSSSSS and the coding buffer gets filled with "abracad".

At abracadabra, the coder finds a match of length 4, at offset 7. The flag state evolves to SSSSSSSM, and the three characters that represent a match length of 4 with an offset of 7 are appended to the coding buffer.

At this point, there are no more characters in the input, so the character corresponding to the flag state SSSSSSSM is appended to the output stream, followed by the content of the coding buffer.

If we map the safe characters to the flag states sequentially, we come to the code point U+005E ('^') to code this flag state. Coding a match length of 4 and an offset of 7 could be accomplished with the characters '%' (U+0025), ')' (U+0029), and '!' (U+0021). The resulting encoding would be '^abracad %)!'.

To decode, the decoder would take the first character and resolve it to a flag state, which gives SSSSSSSM. The decoder would then copy the text seven characters, as is, from the input buffer to the output buffer. It would then interpret the character string '%)!' as an offset/length pair, giving a match length of 4 with an offset of 7, so the decoder would copy the characters "abra" to the end of the output buffer.

Figure 3:
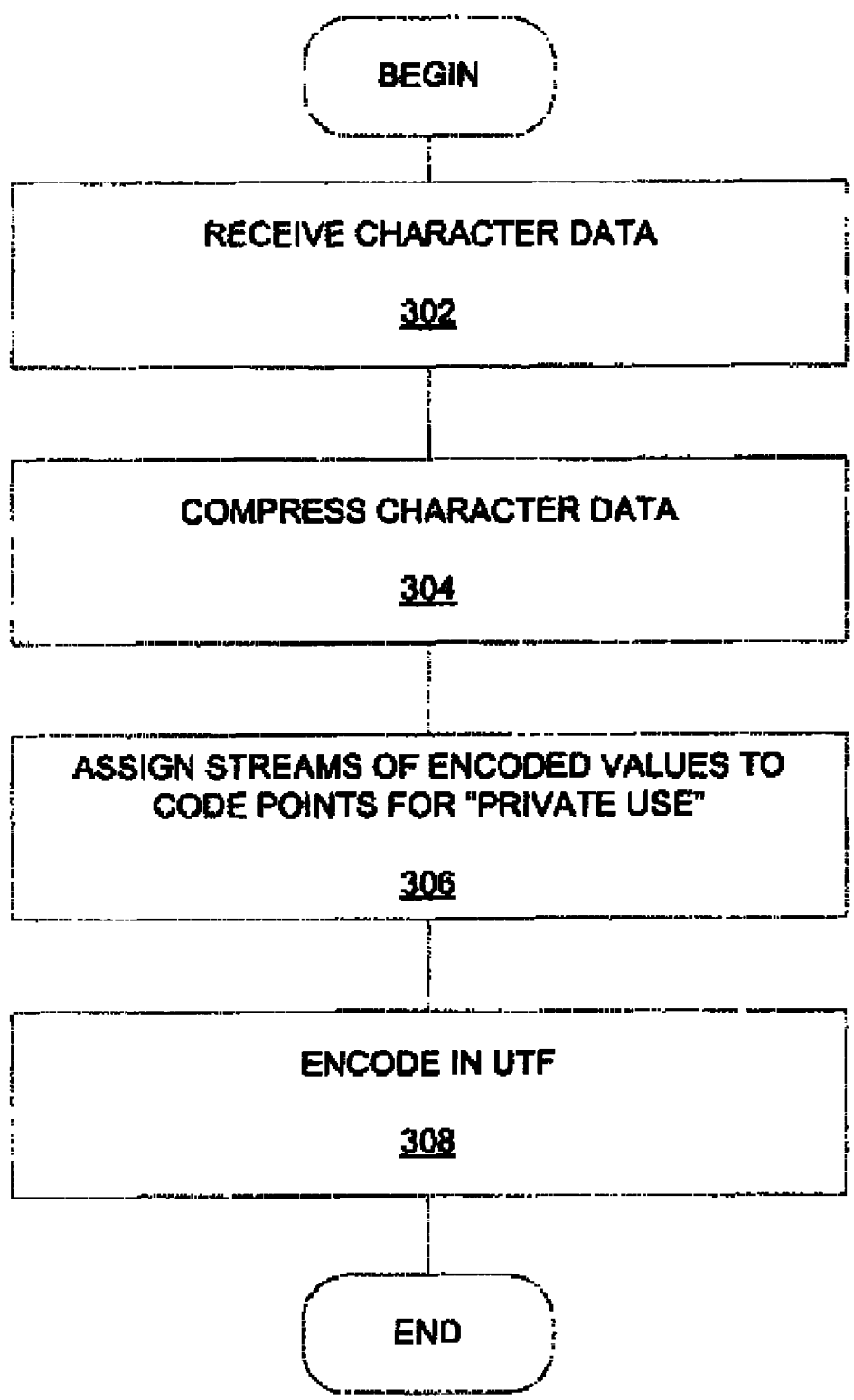
FIG. 3 is a flow diagram illustrating one embodiment of a method for compressing a character data set.

FIG. 3 is a flow diagram illustrating one embodiment of a method for compressing a character data set. At 302, a character data set is received. At 304, the character data set is compressed using an encoder with a dictionary to generate a stream of encoded values. At 306, the stream of encoded values is assigned to code points for "private use" in Unicode. At 308, the stream of encoded values is encoded in UTF according to the previous description.

Figure 4:
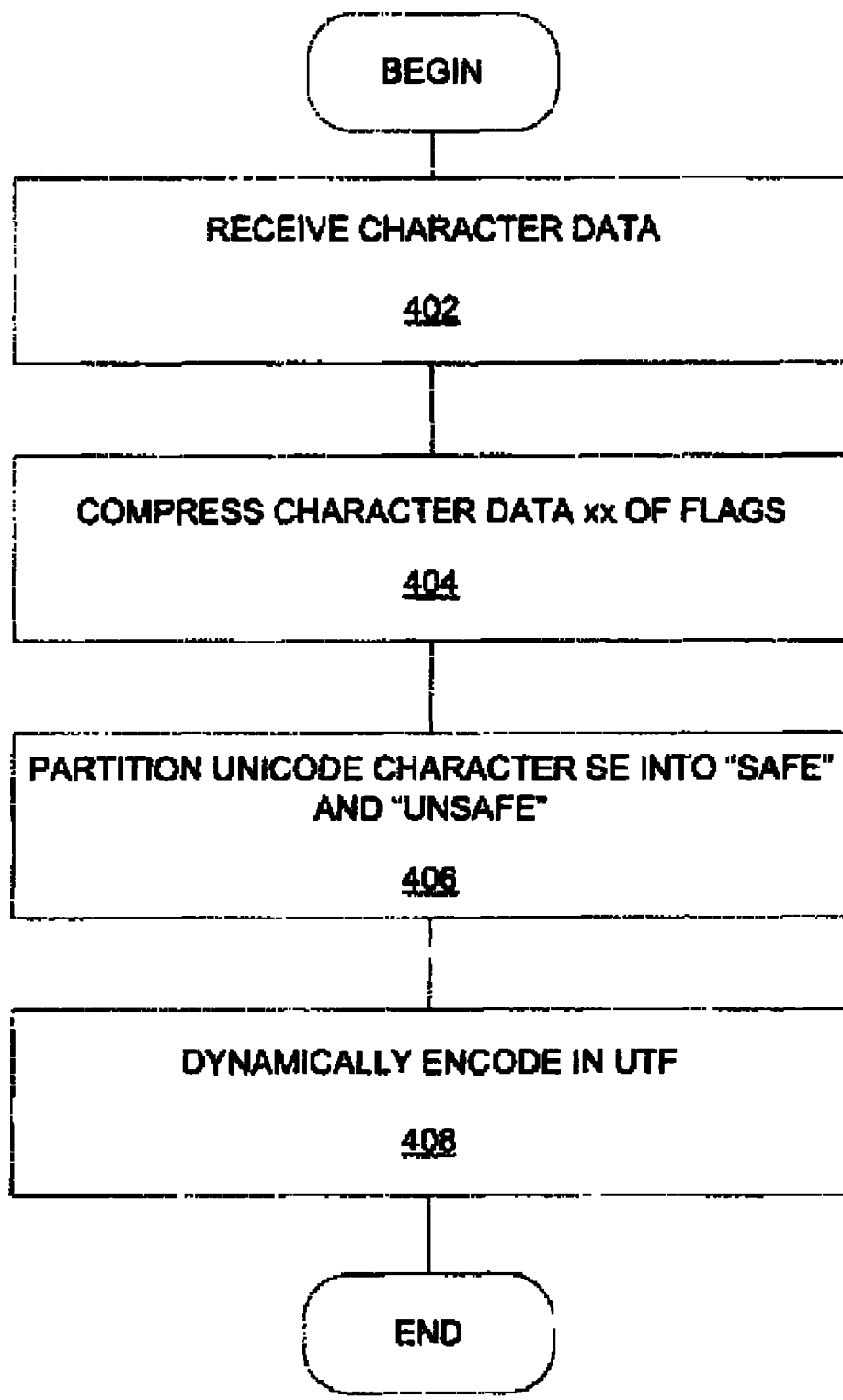
FIG. 4 is a flow diagram illustrating another embodiment of a method for compressing a character data set.

FIG. 4 is a flow diagram illustrating another embodiment of a method for compressing a character data set. At 402, a character data set is received. At 404, the character data set is compressed using a compression with a dictionary such as LZSS or FLAGS. At 406, the unicode character set is partitioned into "safe" and "unsafe" characters. At 408, the encoded stream with safe and unsafe characters is dynamically encoded in UTF according to the previous description.

FIGS. 1 and 2 illustrates a diagrammatic representation of a machine in the exemplary form of a computer system within which a set of instructions, for causing the machine to perform any one or mare of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment,or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to he taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system of 100 and 200 includes a processing device, a main memory (e.g., read-only memory (ROM), flash memory, dynamic random access memory (DRAM) such as synchronous DRAM (SDRAM), a static memory (e.g., flash memory, static random access memory (SRAM), etc.) and a data storage device, which communicate with each other via a bus.

Processing device represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device may also be one or more special-purpose processing devices such as an application specific integrated circuit (ASIC), a field programmable gate array (FPGA), a digital signal processor (DSP), network processor, or the like. The processing device is configured to execute the processing logic for performing the operations and steps discussed herein.

The computer system further include a network interface device.

The data storage device may include a machine-accessible storage medium on which is stored one or more sets of instructions (e.g., software) embodying any one or more of the methodologies, or functions described herein. The software may also reside, completely or at least partially, within the main memory and/or within the processing device during execution thereof by the computer system, the main memory and the processing device also constituting machine-accessible storage media. The software may further be transmitted or received over a network via the network interface device.

While the computer-accessible storage medium is shown in an exemplary embodiment to be a single medium, the term "computer-accessible storage medium" should be taken to include a single medium or multiple media (e.g., a centralized or distributed database, and/or associated caches and servers) that store the one or more sets of instructions. The term "computer-accessible storage medium" shall also be taken to include any medium that is capable of storing, encoding or carrying a set of instructions for execution by the machine and that cause the machine to perform any one or more of the methodologies of the present invention. The term "computer-accessible storage medium" shall accordingly be taken to include, but not be limited to, solid-state memories, optical and magnetic media.

In the above description, numerous details are set forth. It will be apparent, however, to one skilled in the art, that the present invention may he practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to he understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
   receiving a character data set for transcoding;
   compressing the character data set with a compression algorithm module of a computer system to generate one or more streams of encoded values;
   assigning the encoded values to code points reserved for private use in a Unicode format with a code points mapper of the computer system; and
   encoding the streams of assigned encoded values using a Unicode Transformation Format (UTF) with an encoder of the computer system,
   wherein a dictionary of the compression algorithm initially includes code points assigned by the Unicode format and new entries successively assigned to private use code points.

2. The computer-implemented method of claim 1 wherein the compression algorithm includes LZW or LZSS.

3. The computer-implemented method of claim 1 wherein the encoder encodes using UTF-8 or UTF-16, a virtual table of private use code points used to track dictionary entries in UTF-8.

4. The computer-implemented method of claim 1 wherein compressing further comprises:
   encoding offset and length information using the private use code points where the compression algorithm includes LZSS.

5. The computer-implemented method of claim 1 further comprising:
   partitioning the Unicode character set into safe characters and unsafe characters,
   wherein the compression algorithm includes LZSS.

6. The computer-implemented method of claim 5 wherein the compression includes a static coder.

7. The computer-implemented method of claim 5 wherein the compression includes a dynamic coder.

8. A computer-readable storage medium, having instructions stored therein, which when executed, cause a computer system to perform a method comprising:
   receiving a character data set for transcoding;
   compressing the character data set with a compression algorithm module of a computer system to generate one or more streams of encoded values;

assigning the encoded values to code points reserved for private use in a Unicode format with a code points mapper of the computer system; and encoding the streams of assigned encoded values using a Unicode Transformation Format (UTF) with an encoder of the computer system, wherein a dictionary of the compression algorithm initially includes code points assigned by the Unicode format and new entries successively assigned to private use code points.

9. The computer-readable storage medium of claim 8 wherein the compression algorithm includes LZW or LZSS.

10. The computer-readable storage medium of claim 8 wherein the encoder encodes using UTF-8 or UTF-16, a virtual table of private use code points used to track dictionary entries in UTF-8.

11. The computer-readable storage medium of claim 8 wherein compressing further comprises:

encoding offset and length information using the private use code points where the compression algorithm includes LZSS.

12. The computer-readable storage medium of claim 8 further comprising:

partitioning the Unicode character set into safe characters and unsafe characters, wherein the compression algorithm includes LZSS.

13. The computer-readable storage medium of claim 12 wherein the compression includes a static coder.

14. The computer-readable storage medium of claim 12 wherein the compression includes a dynamic coder.

15. A computer system comprising:

a processing device;

a storage device coupled to the processing device, the storage device configured to store a dictionary of a compression algorithm; and a compression module coupled to the storage device, the compression module configured to receive a character data set for transcoding, to compress the character data set with a compression algorithm module of the computer system to generate one or more streams of encoded values, to assign the encoded values to code points reserved for private use in a Unicode format with a code points mapper of the computer system, and to encode the streams of assigned encoded values using a Unicode Transformation Format (UTF) with an encoder of the computer system, wherein a dictionary of the compression algorithm initially includes code points assigned by the Unicode format and new entries successively assigned to private use code points.

16. The computer system of claim 15 wherein the compression algorithm includes LZW or LZSS.

17. The computer system of claim 15 wherein the encoder encodes using UTF-8 or UTF-16, a virtual table of private use code points used to track dictionary entries in UTF-8.

18. The computer system of claim 15 wherein the compression module is further configured to encode offset and length information using the private use code points where the compression algorithm includes LZSS.

19. The computer system of claim 15 wherein the compression module is further configured to partition the Unicode character set into sate characters and unsafe characters, wherein the compression algorithm includes LZSS.

20. The computer system of claim 19 wherein the compression includes a static coder or a dynamic coder.

\* \* \* \* \*